(12) United States Patent
Franca-Neto et al.

(10) Patent No.: US 8,422,296 B2
(45) Date of Patent: Apr. 16, 2013

(54) EARLY DETECTION OF DEGRADATION IN NAND FLASH MEMORY

(75) Inventors: Luiz M. Franca-Neto, Sunnyvale, CA (US); Richard Leo Galbraith, Rochester, MN (US); Travis Roger Oenning, Rochester, MN (US)

(73) Assignee: HGST Netherlands B.V., Amsterdam (NL)

( * ) Notice: Subject to any disclaimer, the term of this patent is extended or adjusted under 35 U.S.C. 154(b) by 174 days.

(21) Appl. No.: 12/930,016

(22) Filed: Dec. 22, 2010

(65) Prior Publication Data

US 2012/0163084 A1    Jun. 28, 2012

(51) Int. Cl.
G11C 11/34 (2006.01)

(52) U.S. Cl.
USPC .............................. 365/185.18; 365/185.25

(58) Field of Classification Search ............. 365/185.18, 365/185.24
See application file for complete search history.

(56) References Cited

U.S. PATENT DOCUMENTS

| | | | |
|---|---|---|---|
| 5,715,193 A | 2/1998 | Norman | |
| 6,118,696 A * | 9/2000 | Choi | 365/185.11 |
| 6,172,910 B1 | 1/2001 | Lee | |
| 7,558,107 B2 * | 7/2009 | Sakurai et al. | 365/185.02 |
| RE41,485 E | 8/2010 | Tanaka et al. | |
| 7,782,674 B2 | 8/2010 | Roohparvar et al. | |
| 2008/0192544 A1 | 8/2008 | Berman et al. | |
| 2008/0307270 A1 | 12/2008 | Li | |
| 2009/0116283 A1 | 5/2009 | Ha et al. | |
| 2010/0061148 A1 | 3/2010 | Komatsu | |
| 2010/0162084 A1 | 6/2010 | Coulson et al. | |
| 2010/0214847 A1 | 8/2010 | Nishihara et al. | |
| 2010/0218068 A1 | 8/2010 | Li et al. | |
| 2010/0309726 A1 | 12/2010 | Yang | |

OTHER PUBLICATIONS

B. Ricco, et al., "Nonvolatile Multilevel Memories for Digital Applications," Proceedings of the IEEE, vol. 86, No. 12, Dec. 1998; pp. 2399-2421.
A. Chimenon and P. Olivo, "Erratic Erase in Flash Memories—Part I: Basic Experimental and Statistical Characterization," IEEE Trans. Elect. Dev., vol. 50, No. 4, Apr. 2003; pp. 1009-1014.
T. Tanzawa et al., "A Compact On-Chip ECC for Low Cost Flash Memory," IEEE J. Solid-State Circ., vol. 32, No. 5, May 1997, pp. 662-669.

(Continued)

*Primary Examiner* — Michael Tran
(74) *Attorney, Agent, or Firm* — G. Marlin Knight

(57) ABSTRACT

Techniques for early detection of degradation in NAND Flash memories by measuring the dispersion of the threshold voltages (VT's), of a set (e.g. page) of NAND Flash memory cells during read operations are described. In an embodiment of the invention the time-to-completion (TTC) values for the read operation for the memory cells are used as a proxy for dispersion of the threshold voltages (VT's). A Dispersion Analyzer determines the dispersion of the set of TTC values. In one embodiment the delta between the maximum and minimum TTC values is used as the dispersion measurement. If the measured TTC dispersion differs by more than a selected amount from a reference dispersion value, a warning signal is provided to indicate that the page of memory has degraded. The warning signal can be used to take appropriate action such as moving the data to a new page.

20 Claims, 7 Drawing Sheets

OTHER PUBLICATIONS

S. Yamada et al., "Degradation Mechanism of Flash EEPROM Programming After Program/Erase Cycles," IEEE IEDM, 1993; vol. 38, Issue 2, Feb. 27, 1998, pp. 185-188.

Tanaka, et al.; "A quick intelligent page-programming architecture and a shielded bitline sensing method for 3 V-only NAND flash memory", IEEE Journal of Solid-State Circuits, vol. 29 Issue:11, Nov. 1994; pp. 1366-1373.

I.E. Opris, "Rail-to-Rail-Multiple-Input Min/Max Circuit," IEEE Trans. Circ. & Systems II, vol. 45, No. 1, Jan. 1998, pp. 137-140.

Douglas Sheldon & Micheal Freie, "Disturb Testing in Flash Memories," NASA WBS: 939904.01.11-10 JPL Project No. 102197; Task No. 1.23.6; 2008. Accessed Nov. 10, 2010 at Internet address http://trs-new.jpl.nasa.gov/dspace/bitstream/2014/40761/1/08-07.pdf.

* cited by examiner

EARLY DETECTION OF DEGRADATION IN NAND FLASH MEMORY

RELATED APPLICATIONS

A related application by the inventors of the present application, which is commonly assigned application and which was filed concurrently with the present application, is titled "Early Detection of Degradation in NOR Flash Memory." The Ser. No. is 12/930,019 with a filing date of Dec. 22, 2010.

A related application by the inventors of the present application, which is commonly assigned application and which was filed concurrently with the present application, is titled "Early Degradation Detection in Flash Memory using Test Cells" The Ser. No. is 12/930,020 with a filing date of Dec 22, 2010.

FIELD OF THE INVENTION

The present disclosure relates generally to non-volatile semiconductor memory, and more particularly to techniques for increasing the reliability of NAND Flash memory by early detection of degradation of performance in NAND Flash memory.

BACKGROUND

EEPROM and Flash memories (NOR and NAND) use a floating gate (FG) to store charges, which represent information. These memory devices suffer from degradation mechanisms after program/erase cycles. They also suffer from erratic erase of memory cells. The specific matrix architecture of NAND Flash leads to more "read disturb" errors than NOR Flash. A "read disturb" occurs when the amount of charge in a memory cell is altered by reading another cell, physically close to or sharing control lines with the disturbed cell. A single read disturb event may not produce enough change in charge content to effect an error, but cumulative read disturbs may eventually do so.

Scaling of technology and the interest in storing more than one bit per cell for increased storage density requires tighter fabrication and operation tolerances. The recognition that ever denser EEPROM and Flash memories need to address unavoidable occasional bit errors led to solutions including error correcting codes.

Multi-Level Cell (MLC) Flash devices can store multiple bits per memory cell by charging the floating gate of a transistor to different selected threshold voltage ($V_T$) levels and, thereby, use the analog characteristic of the cell in mapping a bit pattern to a specific voltage level. In the case of NAND Flash, the $V_T$ of MLC devices are, conceptually, read by sequentially applying selected read voltage ($V_{READ}$) levels to the floating gates of the cells. Typically, the voltage ranges are selected with a guardband between each range to help ensure that the normal $V_T$ distributions do not overlap.

In NOR Flash, cells are connected in parallel to the bitlines, which allows cells to be individually read and programmed.

Published U.S. patent application 20080307270 by Tieniu Li (Dec. 11, 2008) describes a scheme implemented on a host device for detection of emerging bad blocks in a NAND that includes keeping at least a partial history of errors during read operations.

Published U.S. patent application 20100214847 by Nishihara, et al. describes a NAND Flash memory system that is said to reduce variations in the read disturb characteristic from chip to chip by that including a peripheral circuit that includes means for storing and retrieving a corrected read voltage for use by a memory controller. The memory controller performs data input/output control and data management on the Flash memory, adds error correction codes (ECC) upon writing, and analyzes the error correction codes upon reading.

Given that degradation of memory content is progressive and unavoidable with time and number of program/erase cycles, there is a need for an early warning system that detects degradation while data is still correctly being read and mitigating actions can be taken without data loss. Such a system can stand alone or be complementary to error correcting schemes to further increase reliability and operational life of EEPROM and Flash memories.

SUMMARY OF THE INVENTION

The embodiments of the invention in this disclosure describe techniques for early warning of degradation in NAND Flash memories by measuring the dispersion of the threshold voltages ($V_T$'s), of a set (e.g. page) of NAND Flash memory cells during read operations. Extension of the operational life of Flash memories is enabled by such an early warning system, for instance, by identifying data at risk of becoming corrupted which can then be refreshed or moved around in the Flash chip in response to early signs of degradation. And, early signs of degradation are identified by significant widening of $V_T$ distribution with time. In particular for applications where freshly written data will be likely to be read first, this will tend to extend operational life of the device to the limit where (a) there is available space into which data can be moved and (b) these refreshing actions take significant less time to reconstitute data than the degradation mechanisms take to corrupt freshly written data. In the extreme limit of (b), the operation of the NAND Flash chip can be extended to a point where refreshing and moving of data in the chip become frequent enough to make the Flash chip volatile, but still preserve its correct functionality and data integrity.

In an embodiment invention, the dispersion in time-to-completion (TTC) values in a read operation is used as a proxy for dispersion of the threshold voltages ($V_T$'s) in the memory cells queried in this read operation. The TTC is the time from triggering the sense amplifiers to evaluate the bit-line separation to full voltage development in those bitlines in the read operation of the memory cells. In such an embodiment invention, the read controller for a NAND Flash memory cell structure includes means for measuring the time-to-completion (TTC) of the full voltage development of bitlines and reporting the TTC to a Dispersion Analyzer. The Dispersion Analyzer obtains TTC data for each cell in a page which was read and determines the dispersion of the set of TTC values. In one embodiment the delta between the maximum and minimum TTC values is used as the dispersion measurement. The measured TTC dispersion is then compared to a reference dispersion value. If the measured TTC dispersion differs by more than a selected amount from the reference dispersion value, a warning signal is provided to indicate that the page of memory has degraded. Higher level management in the storage system can use the warning signal to take appropriate action such as moving the data to a new page or marking the degrading page as bad.

In one embodiment the TTC is reported as an analog voltage, and the Dispersion Analyzer determines the spread between the maximum and minimum analog voltage values as a measure of the dispersion of TTC values for the page.

Alternative embodiments include an integrated system for NAND Flash memory that provides soft information for error correcting codes in a single read operation based on the dispersion of $V_T$S. The early warning system can also be used as a basis to assign probabilities for the correctness of the data read from memory. With a single read, soft information can be added to the read data, which would enable novel coding and decoding schemes for high density Flash memories. The single read implies that the retrieval of soft information is achieved with no read throughput performance penalty. Since every cell's $V_T$ position in an ideal distribution can be estimated with an early degradation detection system as described in this disclosure, in an embodiment, the data from each cell can have a confidence level assigned depending on how far from the mean of an ideal distribution the $V_T$ from each cell is.

Embodiments of Flash memory devices according to the invention can be used in solid state drives (SSDs).

DETAILED DESCRIPTION OF THE INVENTION

Figure 1:
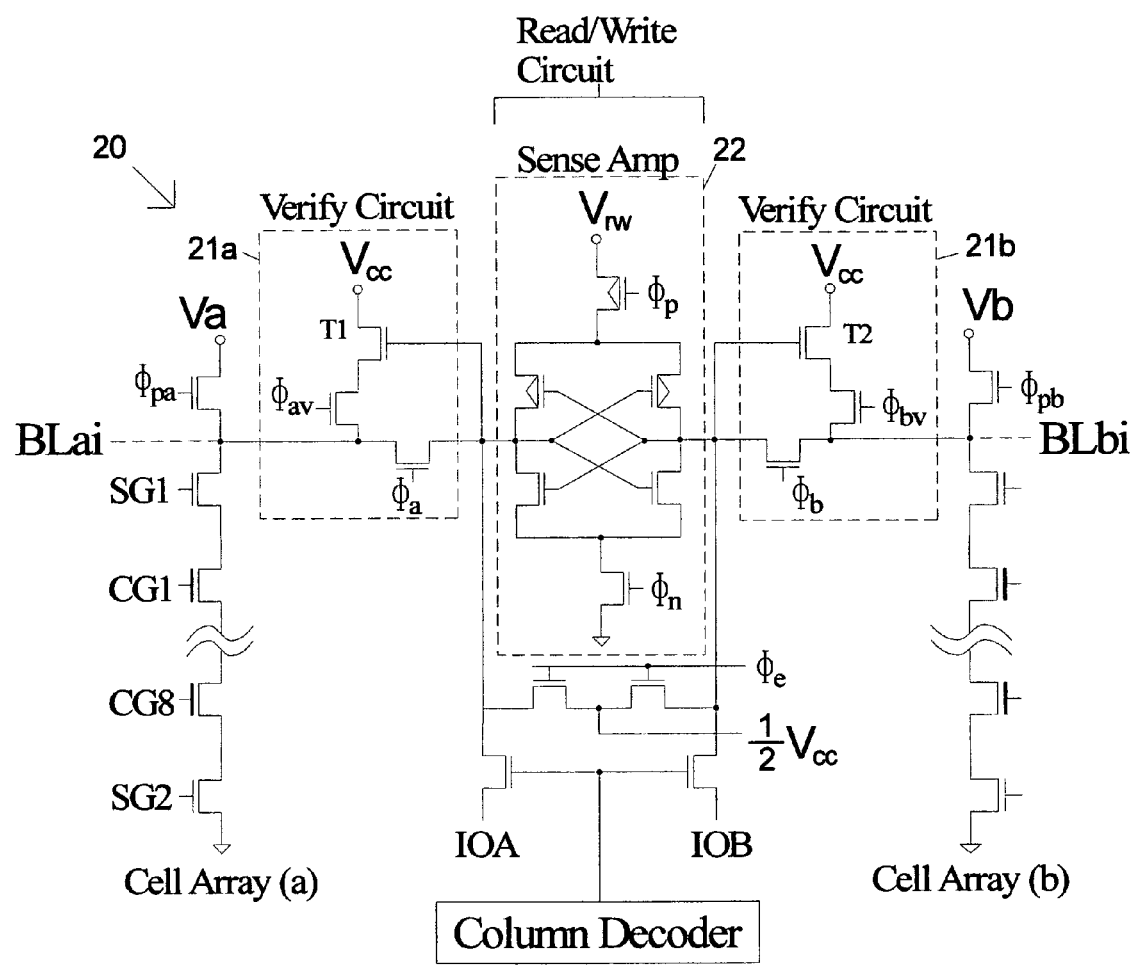
FIG. 1 is an illustration of a prior art NAND Flash memory cell structure.

A prior art NAND Flash memory cell structure 20 is illustrated in FIG. 1. Note that other memory cells, with any valid programmed $V_T$ levels, are placed in series with a NAND Flash memory cell being queried. (Note: This is not the case for NOR Flash memory.) The NAND-structured cells are divided into two cell strings with cell string (a) shown as the left-hand column of transistors from the actual memory array and cell string (b) as the right-hand column of reference transistors. The cell structure 20 includes by bit-by-bit verify (BV) circuits 21a, 21b which are connected to each of the two bitlines BLai, BLbi. The two bitlines and BV circuits share a common READWRITE (R/W) circuit similar to an open-bit-line architecture of a DRAM. The R/W circuit acts as a flip-flop type differential sense amplifier 22 in the read operation and as a data latch circuit in the program/write operation.

Figure 2A:
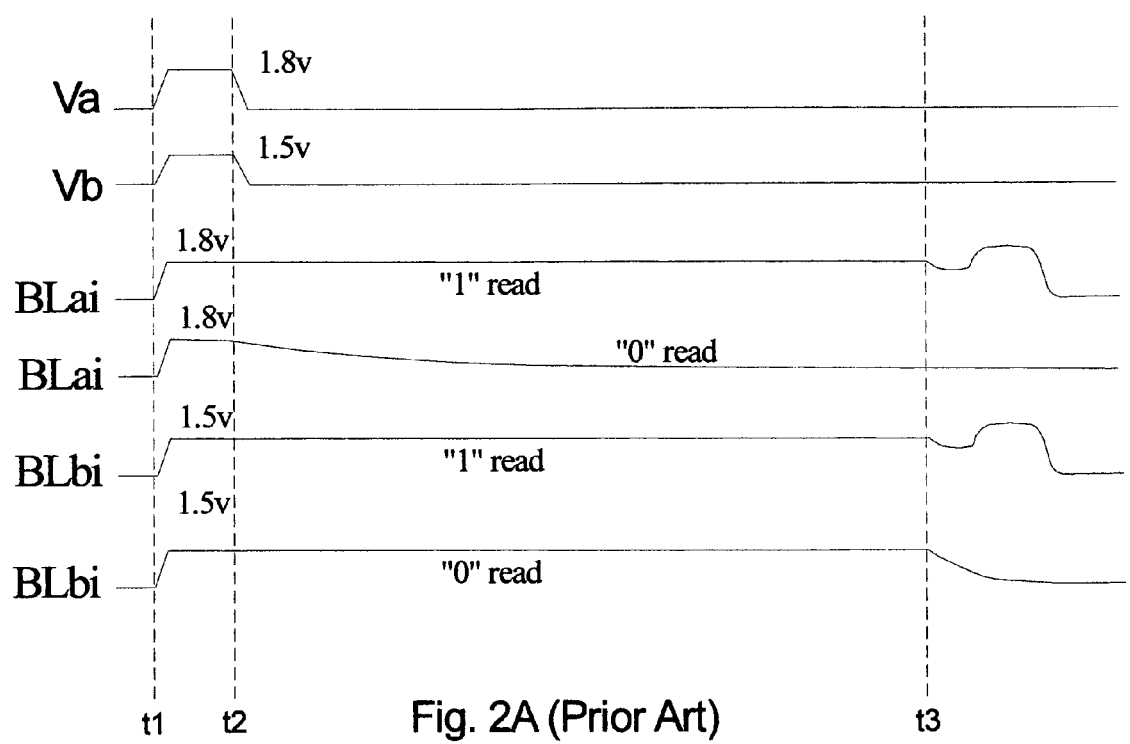
FIG. 2A is an illustration of selected timing curves for a read operation for the prior art NAND Flash memory cell structure of FIG. 1.

Selected timing curves for a read operation of the structure of FIG. 1 are shown in FIG. 2A with selected points in time t1, t2 and t3. For simplicity, all timing diagrams and discussions assume perfectly matched readout circuits for the parallel reading of all cells in a page. Mismatches in those circuits can be accounted for by simple calibration procedures. For instance, a reference readout using specific cells with known content can be used to correct sense amps mismatches in later readouts of cells in the memory array.

Figure 2B:
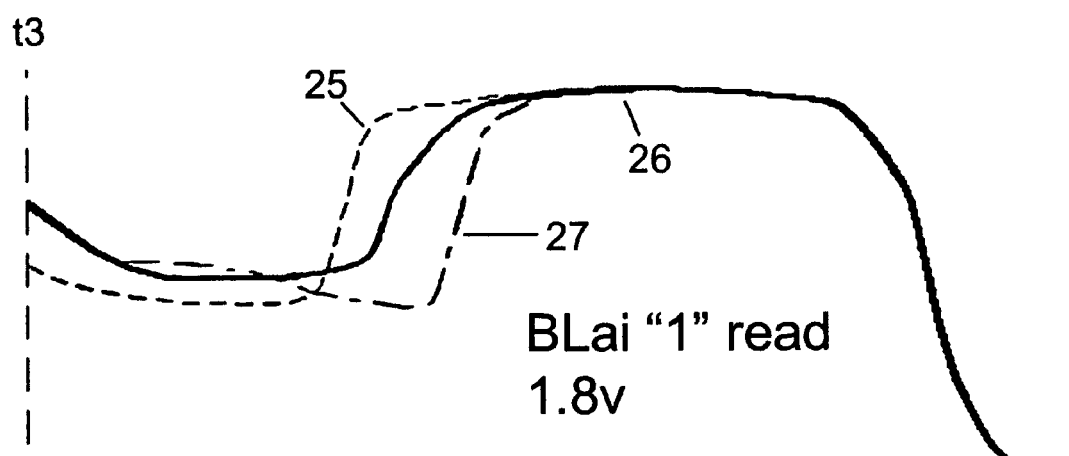
FIG. 2B is an illustration of selected timing curves for a read operation for a set of prior art NAND Flash memory cell structures of FIG. 1 showing a possible range of timing curves for the set.

The sense amplifier 22, which is a comparator, typically uses a regenerative loop to develop a small separation of input lines after the pass gates from bitlines BLai and BLbi in FIG. 1 into fully developed output voltage levels. The circuit in FIG. 1 and the curves in FIG. 2A are fairly representative of a NAND Flash readout. FIG. 2B is an illustration of a selected portion following t3 of the BLai "1" read for 1.8v a set of prior art NAND Flash memory cell structures of FIG. 1 showing the typical timing curve 26 and an example of a possible range of timing curves for a set of cells bounded by lines 25, 27. The BLbi signal for a set of cells will show a similar distribution of timing curves. Embodiments of the invention detect changes in the dispersion in the performance of a page of cells by measuring or estimating the time to completion (TTC) for the set of cells. Dispersion in the timing of the rising portion of the curves will become differences in time to completion (TTC) for the read operation. It should be noted that FLASH readout circuits typically include features to ensure that normal dispersion in timing performance never produces errors in readout, i.e. the circuits are "sandbagged." Thus, the invention is this disclosure brings to light an aspect of Flash memory that was not well known by those practicing the art and uses the phenomenon in novel applications.

The NAND Flash architecture results in different series resistance being presented with the selected cell depending on the different content states in the non-selected memory cells. Hence, NAND Flash memory cell content is queried and compared to different reference levels in sequential steps, where different levels of $V_T$ are queried.

A page of memory cells are read in parallel in a NAND Flash memory, which requires that the read operation be launched by suitable synchronized time signals. The timing signal will equalize the lines of all sense amplifiers for the page, but stronger and weaker cells will drive the sense amplifier lines differently (after equalization) and, therefore, the time from triggering the latches to full voltage development at the output of the sense amps time (i.e. the TTC) will be different for stronger and weaker cells. According to the invention these differences in the time-to-completion (TTC) can be measured and stored in suitable form for further analysis by the system.

Since all memory cells in the NAND Flash matrix are nominally identical, and each one is programmed to a threshold voltage, $V_T$, that produces a predefined current level when queried with an specific voltage level ($V_{READ}$) immediately above their programmed $V_T$, then:

(i) the dispersion in TTC will be a proxy of the dispersion in $V_T$ of the cells being read.

(ii) values of dispersion in TTC at the start of life of a Flash memory page can be saved as a reference value and compared to later measured dispersion at read outs to determine when memory cells degraded beyond a limit that warrants data protection action.

(iii) the knowledge of the dispersion in TTC from each cell in a read operation can be used to assign soft information to each determined memory cell content.

Figure 3:
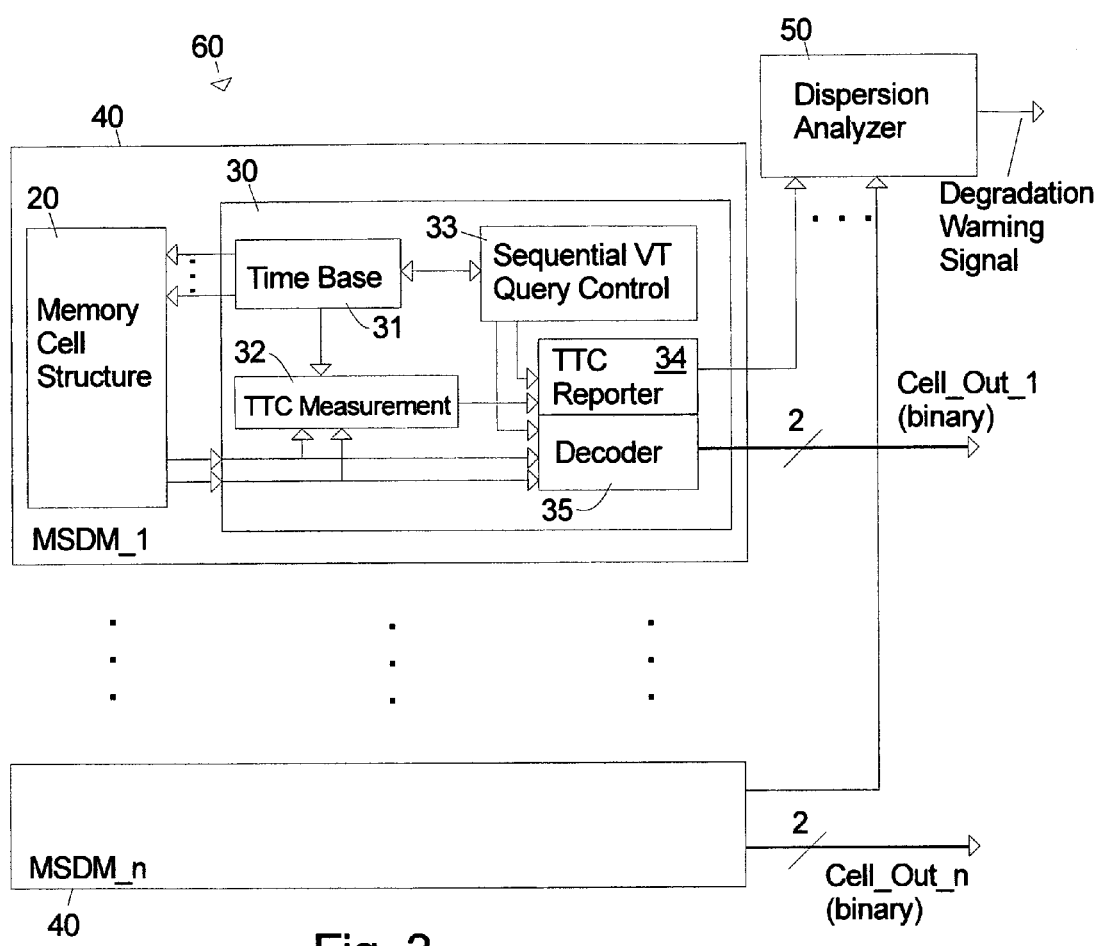
FIG. 3 is an illustration of selected components in a NAND Flash memory page according to an embodiment of the invention.

FIG. 3 shows selected functional blocks for a NAND Flash page 60 with an Early Detection of Degradation System according to an embodiment of the invention. The Controller 30 includes Time Base 31, Sequential $V_T$ Query Control 33 and Decoder 35, which are designed according to the prior art and will not be described in detail. The Decoder 35 outputs the corresponding binary code for the memory cell content once the $V_T$ of the memory cell is determined. The Sequential $V_T$ Query Control 33 is an abstraction for the circuits used in the NAND Flash that sequentially searches for the correct $V_T$ in the selected memory cell. Time Base 31 generates the necessary time signals for the pass gates and latches in the sense amplifier and also times the Time-to-Completion (TTC) measurement unit 32.

The Time-to-Completion (TTC) measurement unit 32 measures the time required for the bitlines output driven by a memory cell in the Memory Cell Structure 20 to reach their final values. A Controller 30 and a Memory Cell Structure 20 form a unit which will be called a Memory Structure with Dispersion Measurement (MSDM) unit 40. A page of memory will require multiple MSDMs (MSDM_1 . . . MSDM_n), which are connected in parallel to the Dispersion Analyzer 50. In commercial Flash, Memory Cell Structures are actually implemented in memory arrays with shared circuits without departing from the spirit of this description. FIG. 3 is hence a simplified description constructed to illustrate the concepts of the invention, and is provided for illustration purposes only, not for limiting the invention.

In a sequential read process, the sense amplifier in the Memory Cell Structure will only develop full output a specific direction when input reference from the dummy bitline (BLbi) are above the $V_T$ of the memory cell under read operation, i.e. being queried. Thus, the content of the selected memory cell will be determined and decoded in binary form. Also at this moment, the proper time-to-completion (TTC), which has been measured by Time-to-Completion measurement unit 32, will reported by the TTC Reporter 34 to the Dispersion Analyzer 50. The TTC Reporter 34 may include buffers and signal conditioning to properly convey the information of time-to-completion to the Dispersion Analyzer 50.

Figure 4:
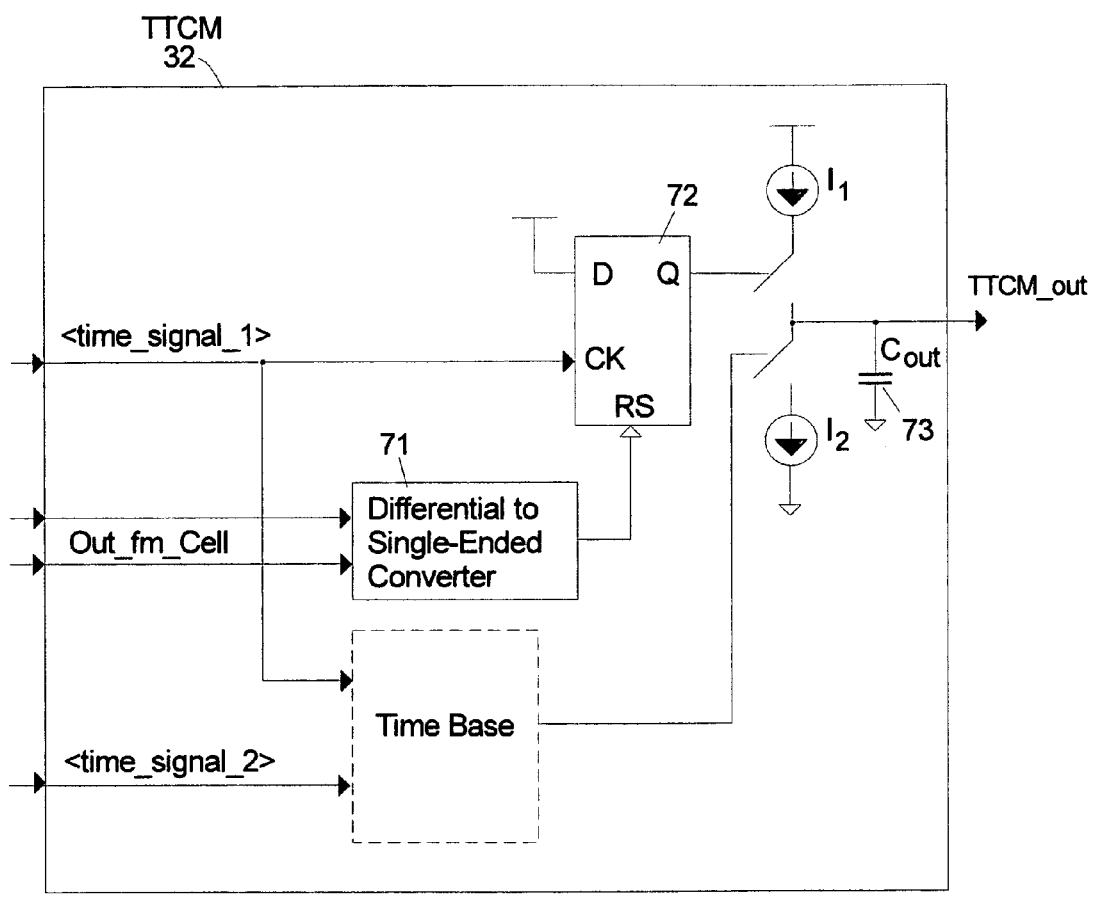
FIG. 4 is an illustration of selected functional design blocks for a time-to-completion measurement unit according to an embodiment of the invention.

An illustration of an embodiment of a Time-to-Completion measurement unit 32 is shown in FIG. 4. This embodiment is similar to charge-pump circuits used in phase detector circuits for Phase-Locked Loop (PLL) systems. In this illustrative realization, but not in any limiting form, the time to completion information is stored in a charge in capacitor 73 $C_{out}$ inside the TTC measurement unit 32. The voltage on the capacitor is proportional to the time that current from current source 11 is allowed to flow into the capacitor through switch S1. Switching of S1 is controlled by flip-flop 72, which is reset by the output from a differential to single-ended converter 71. The differential to single-ended converter 71 uses the two binary outputs from the Memory Cell Structure as input. A correct time to completion is reported to the Dispersion Analyzer (DA) after the $V_T$ of the memory cell is determined. The capacitor 73 is drained through switch S2 and current source 12 based on a signal from the time base.

Figure 5:
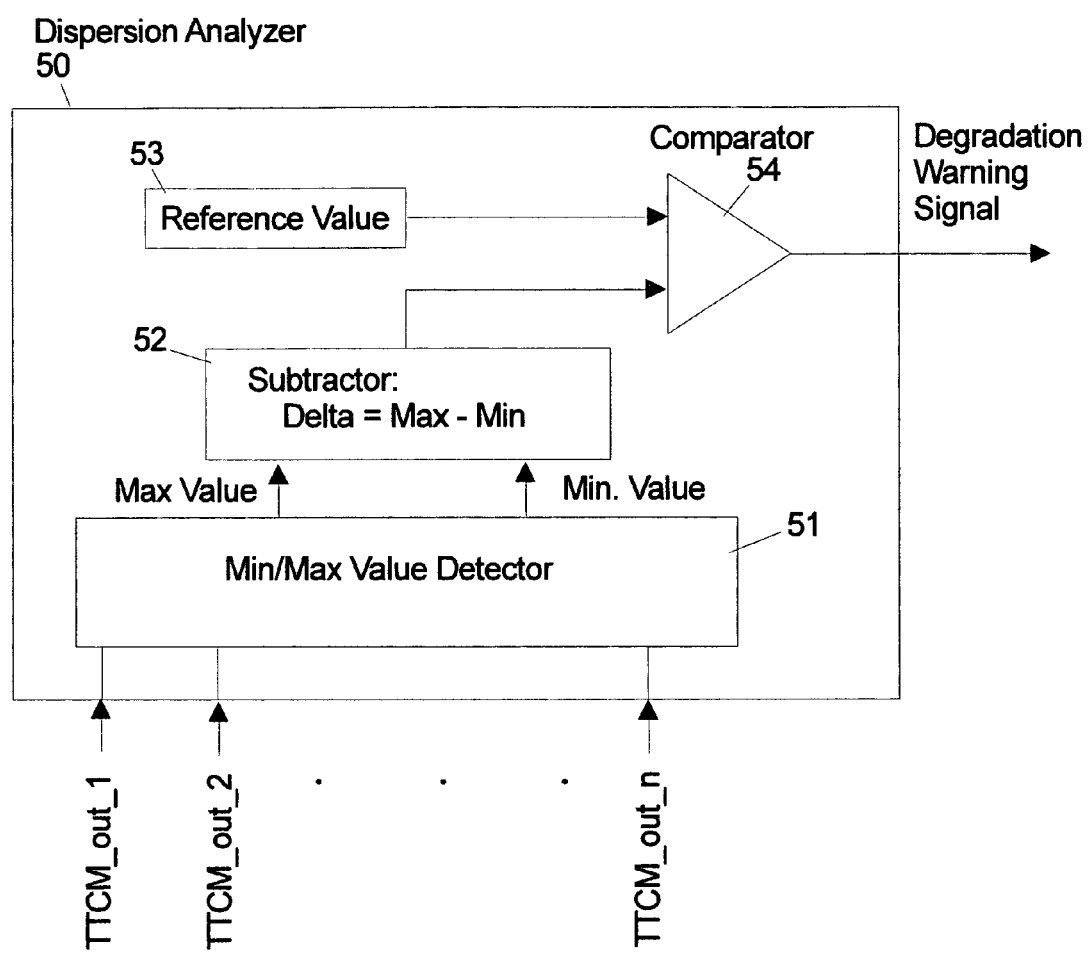
FIG. 5 is an illustration of selected functional design blocks for a dispersion analyzer according to an embodiment of the invention.

FIG. 5 is an illustration of selected functional design blocks for a Dispersion Analyzer 50 according to an embodiment of the invention. The Dispersion Analyzer 50 is an analog signal processing block. In this embodiment, its function includes determining the maximum and minimum time of completion from the TTC measurement units 32 for a page read operation. Each TTC 32 outputs an analog voltage level which pass through the TTC Reporters 34 and on to the Dispersion Analyzer 50. The Min/Max Detector 51 in the Dispersion Analyzer determines the maximum voltage and the minimum voltage at its multiple inputs from the TTC Reporters. The difference (delta) between the overall maximum and minimum value is determined as the measure of the dispersion for the page by the Subtractor 52. The Dispersion Analyzer uses Comparator 54 to determine if the computed delta is greater than a Reference Value 53 and sets the warning signal accordingly. The reference value is a pre-determined threshold or an initial value established at the beginning of life of the NAND Flash memory. In an embodiment, at the start of operation of the NAND Flash chip in a storage system, after a program command, a read command is issued to establish the reference value for comparing future dispersion in $V_T$ at each read operation. Thus, the reference value can be set as part of the manufacturing process by having the Dispersion Analyzer compute an initial delta between the overall maximum and minimum value and save that initial delta as the reference value.

Figure 6:
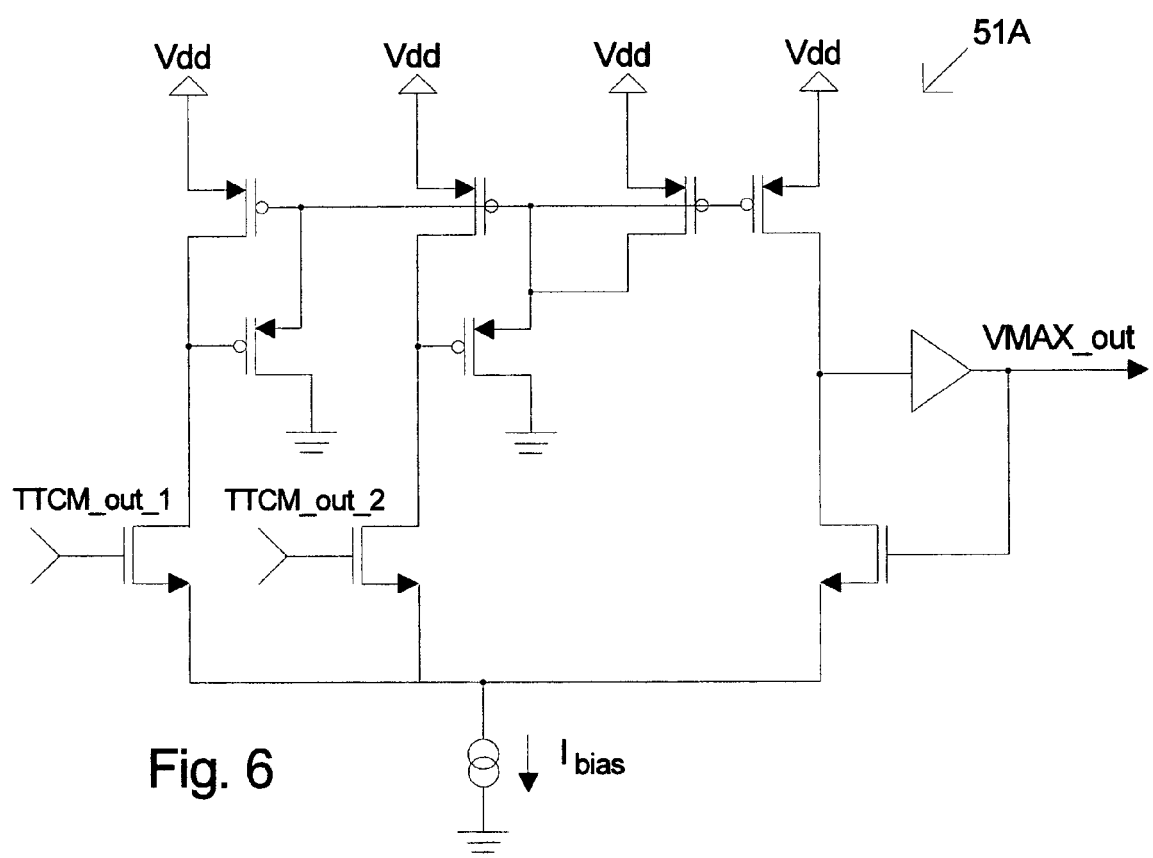
FIG. 6 is an illustration of a design for a maximum voltage detector for use in a dispersion analyzer according to an embodiment of the invention.

FIG. 6 is an illustration of a design for a maximum voltage detector for use in a Min/Max Detector 51 dispersion analyzer according to an embodiment of the invention. In FIG. 6, an example of a CMOS circuit for maximum input voltage determination is shown. It is a "winner-takes-all" circuit. The output of this circuit follows the maximum input voltage to the accuracy of 1 mV difference between input levels. The number of inputs in the circuit can be straightforwardly augmented by replication of the circuits, or the two input circuit can be arrayed in a hierarchical tree. In order to follow the minimum input voltage, a suitable change in the inset circuit from NMOS to PMOS is used.

The early degradation detection just described can be used to assign probability of error or confidence level of correctness to the content read from each memory cell. Information on the position of the $V_T$ of each cell read by means of information on time-to-completion (TTC) measurement can be used to assign a confidence level of correctness to the data read from each cell. This allows for novel and more efficient encoding and error correction algorithms to be used on NAND Flash chips equipped with such capability to inform position of $V_T$ in an ideal distribution for each cell data read. All requiring a single readout.

Embodiments of Flash memory devices according to the invention can be used in solid state drives (SSDs) which provide a data storage function similar to that provided by hard disk drives. SSDs are typically designed to emulate hard disk drives.

While the present invention has been shown and described with reference to particular embodiments, the invention is limited in scope only as specified in the appended claims.

The invention claimed is:

1. A NAND Flash memory device comprising:
   a set of memory cells;
   a set of measurement units, with each measurement unit being connected to one memory cell in the set of memory cells, each measurement unit producing a measurement signal that is a measure of a memory cell's threshold voltage in a read operation; and
   a dispersion analyzer that receives the measurement signals and determines a current dispersion value for the measurement signals for the set of memory cells, and generates an output signal indicative of the current dispersion value differing from a reference dispersion value by more than a threshold amount.

2. The device of claim 1 wherein each measurement signal is derived from the memory cell's time-to-completion for a read operation.

3. The device of claim 2 wherein each measurement signal is an analog voltage.

4. The device of claim 3 wherein the dispersion analyzer further comprises:
   a maximum detector that outputs a first voltage that corresponds to a maximum voltage in the measurement signals from the set of measurement units;
   a minimum detector that outputs a second voltage that corresponds to a minimum voltage in the measurement signals from the set of measurement units; and
   means for determining a delta between the maximum voltage and the minimum voltage as the current dispersion value.

5. The device of claim 2 wherein each measurement signal is an analog voltage obtained by charging a capacitor with a selected current during the read operation.

6. The device of claim 1 wherein the reference dispersion value is established by recording a current dispersion value determined by the dispersion analyzer at a selected prior time.

7. The device of claim 1 further comprising means for moving data recorded on the set of memory cells to a second set of memory cells in response to the dispersion analyzer's output signal.

8. The device of claim 1 wherein each measurement unit measures a time from triggering sense amplifiers used in the read operation to full voltage development of the memory cell.

9. The device of claim 1 wherein the dispersion analyzer generates the output signal for each read operation without requiring additional operations.

10. The device of claim 1 further comprising means for determining a confidence level for each memory cell based upon divergence of the measurement signal from a predetermined mean value.

11. The device of claim 1 further comprising means for error correction using divergence of the measurement signal for one or more memory cells from a predetermined mean value.

12. A method of operating a NAND Flash memory device comprising:
    generating a set of measurement values for a set of memory cells, each measurement value being indicative of a threshold voltage for one of the memory cells in a read operation;
    analyzing dispersion in the set of measurement values to determine a current dispersion value for the set of memory cells; and
    generating an output signal indicative of the current dispersion value differing from a reference dispersion value by more than a threshold amount.

13. The method of claim 12 wherein each measurement value is a time-to-completion for a read operation.

14. The method of claim 13 wherein analyzing dispersion further comprises:
    detecting a maximum value in the set of measurement values;
    detecting a minimum value in the set of measurement values; and
    determining a delta between the maximum time and the minimum time as the current dispersion value.

15. The method of claim 13 wherein each measurement value is represented as an analog voltage.

16. The method of claim 15 wherein the analog voltage obtained by charging a capacitor with a selected current during the read operation.

17. The method of claim 12 wherein the reference dispersion value is determined by recording a current dispersion value at a selected prior time.

18. The method of claim 12 further comprising moving data recorded on the set of memory cells to a second set of memory cells in response to the output signal indicative of the current dispersion value differing from a reference dispersion value by more than a threshold amount.

19. The method of claim 12 further comprising determining a confidence level for each memory cell based upon divergence of the measurement value from a predetermined mean value.

20. The method of claim 12 further comprising correcting errors using divergence of the measurement value for one or more memory cells from a predetermined mean value.

* * * * *

UNITED STATES PATENT AND TRADEMARK OFFICE
CERTIFICATE OF CORRECTION

| | | |
|---|---|---|
| PATENT NO. | : 8,422,296 B2 | Page 1 of 1 |
| APPLICATION NO. | : 12/930016 | |
| DATED | : April 16, 2013 | |
| INVENTOR(S) | : Luiz M. Franca-Neto, Richard Leo Galbraith and Travis Roger Oenning | |

It is certified that error appears in the above-identified patent and that said Letters Patent is hereby corrected as shown below:

In the Claims:

In the 3rd line of claim 6, at column 7, line 6, the word 'lime' should read --time--.

Signed and Sealed this
Twelfth Day of August, 2014

Michelle K. Lee
*Deputy Director of the United States Patent and Trademark Office*